(12) United States Patent
Carter, Jr. et al.

(10) Patent No.: US 6,401,765 B1
(45) Date of Patent: Jun. 11, 2002

(54) LEAD FRAME TOOLING DESIGN FOR EXPOSED PAD FEATURES

(75) Inventors: Buford H. Carter, Jr., Richardson; Dennis D. Davis, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/643,368

(22) Filed: Aug. 22, 2000

(51) Int. Cl.[7] ................................................ B21F 45/00
(52) U.S. Cl. ................................................... 140/105
(58) Field of Search .......................... 72/414, 415, 478; 140/105

(56) References Cited

U.S. PATENT DOCUMENTS

| | | | | |
|---|---|---|---|---|
| 2,851,081 A | * | 9/1958 | Klasek | 72/414 |
| 5,105,857 A | * | 4/1992 | Ellis | 140/105 |
| 6,151,948 A | * | 11/2000 | Ashworth et al. | 72/359 |

* cited by examiner

*Primary Examiner*—Lowell A. Larson
(74) *Attorney, Agent, or Firm*—W. Daniel Swayze, Jr.; W. James Brady; Frederick J. Telecky, Jr.

(57) ABSTRACT

A modular tool for forming features in an exposed pad having a pad surface between a bleed groove and an edge of the pad surface in a lead frame including a first tool for forming a bottom of the exposed pad under the pad surface, a second tool coupled to the first tool for forming a side of the exposed pad, and a third tool coupled to the first tool for forming another side of the exposed pad.

1 Claim, 5 Drawing Sheets

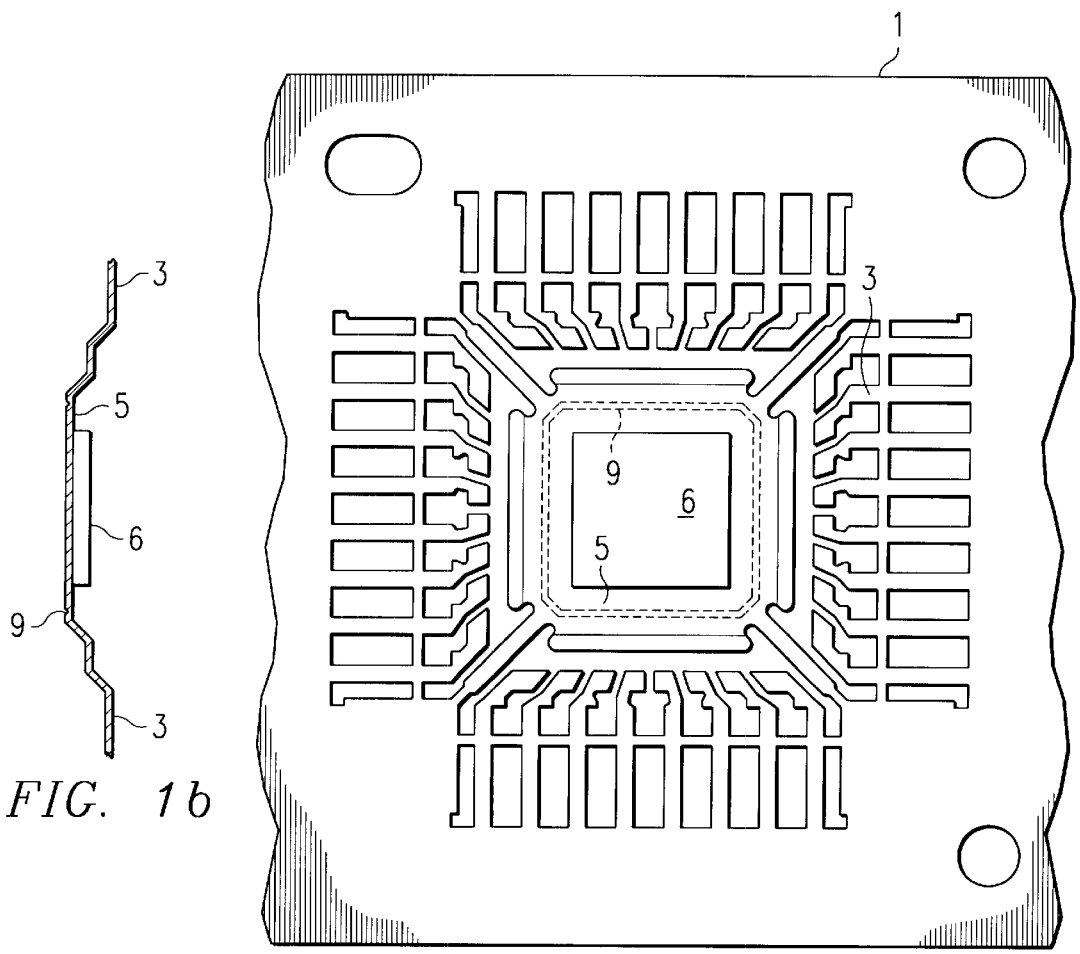
FIG. 1a
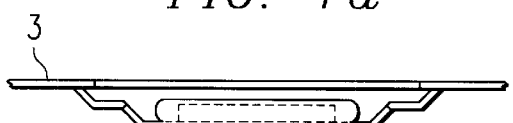
FIG. 1b  FIG. 1c
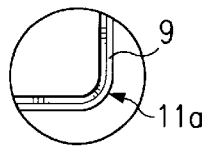 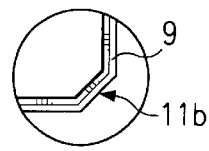 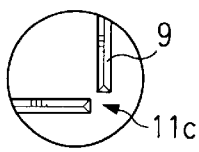
FIG. 1d    FIG. 1e    FIG. 1f
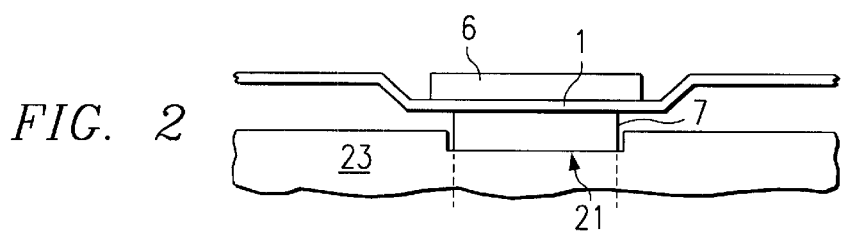
FIG. 2

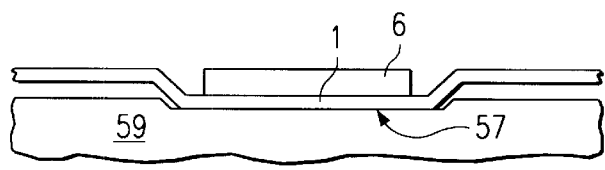
FIG. 10
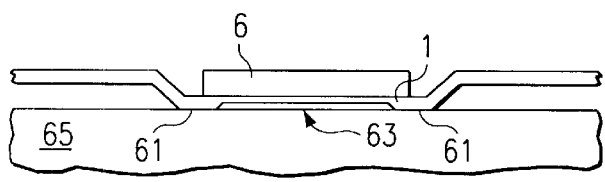
FIG. 11
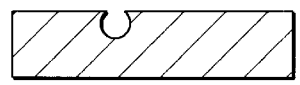
FIG. 12a
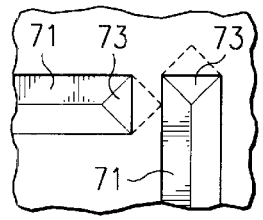
FIG. 13a
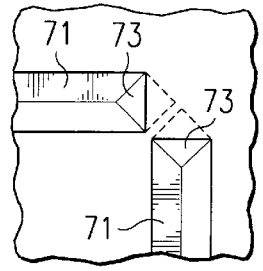
FIG. 13b
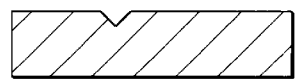
FIG. 12b
FIG. 12c
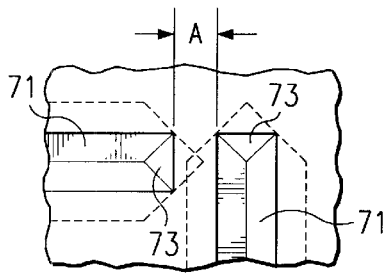
FIG. 13c
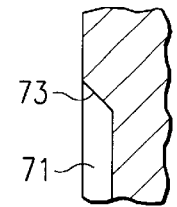
FIG. 13d
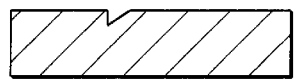
FIG. 12d
FIG. 12e
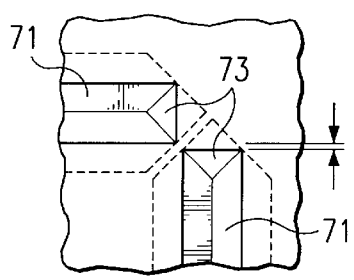
FIG. 13e

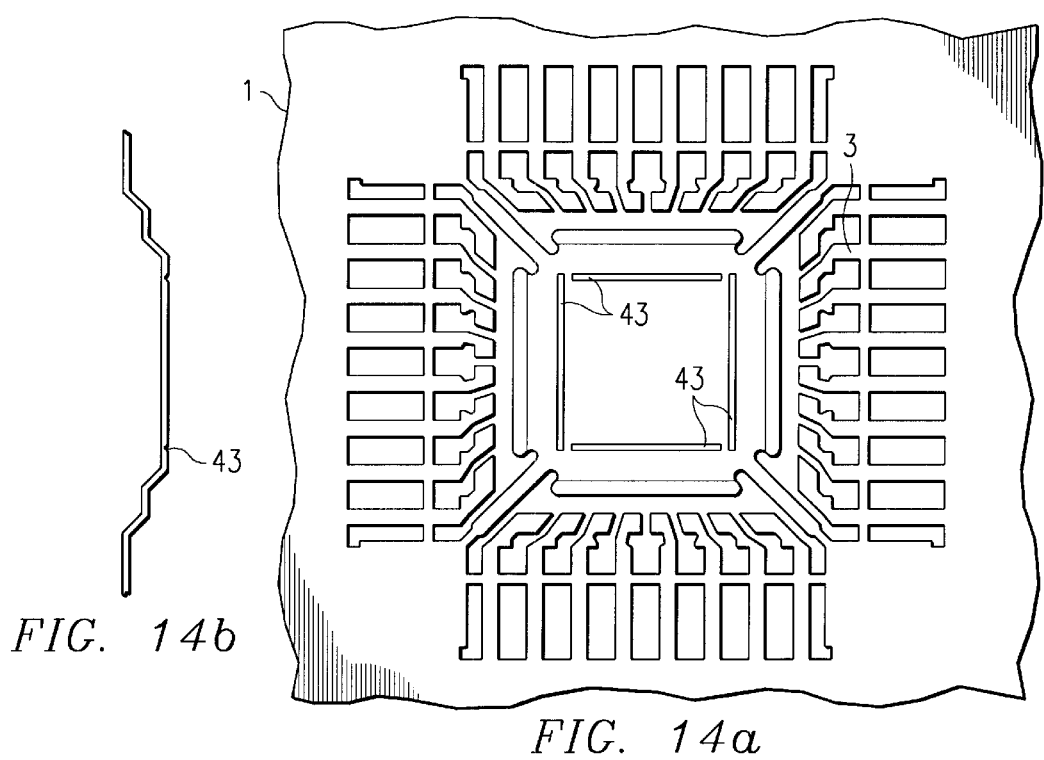
FIG. 14b
FIG. 14a
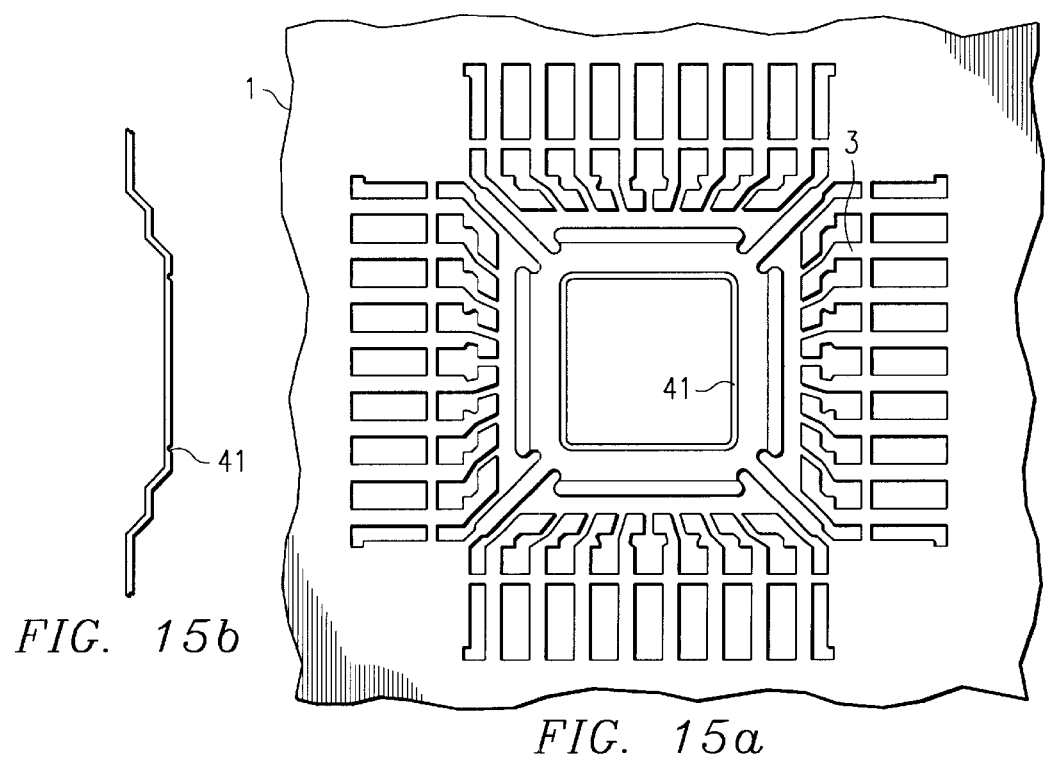
FIG. 15b
FIG. 15a

LEAD FRAME TOOLING DESIGN FOR EXPOSED PAD FEATURES

FIELD OF THE INVENTION

The present invention relates to a method for forming exposed pad features during lead frame downset for preventing bleed of encapsulant over an integrated circuit exposed pad or slug for utilization as a heat sink.

BACKGROUND OF THE INVENTION

In the fabrication of integrated circuits, it is often necessary to provide an exposed thermal pad or slug of highly thermally conductive material, such as, for example, copper, which is an integral part of or attached to a lead frame in order to conduct heat away from the semiconductor chip attached to the lead frame. The preferred finish for an exposed pad lead frame is palladium so as to avoid any wet process steps. The purpose of the palladium coating, when used, is set forth in Ser. No. 08/190,729, the contents of which are incorporated herein by reference. The exposed thermal pad is generally defined as the surface of the lead frame opposed to and adjacent to the semiconductor chip. It should be understood that, as an alternative, the lead frame can be made thicker in the region of the thermal pad or with an attached thermal slug. A portion of the processing operation involves encapsulation of the chip and lead frame, this operation requiring that the thermal pad be exposed to the external environment in order to allow for maximum dissipation of heat from the semiconductor chip to the external environment through the thermal pad. During encapsulation, the pad is disposed against the mold surface, preferably under compression against the mold surface, to minimize the likelihood of encapsulant traveling between the mold surface and the thermal pad and thereby over the thermal pad surface.

A problem that arises during the encapsulation as described above is that the compression of the thermal slug against the mold surface is often insufficient to prevent mold bleed wherein the molding material not only encapsulates the lead frame and semiconductor chip, but the molding material also passes over and forms a thin, generally transparent coating over the thermal pad. This coating of encapsulant over the thermal pad reduces the thermal performance of the thermal pad by reducing the exposed pad area. The encapsulant coating over the thermal pad also prevents or reduces the ability to bond or solder to the external thermal sink. In addition, irregular mold bleed makes it difficult to specify manufacturing limits and causes a problem during quality control to judge acceptable and unacceptable criteria. Uncontrolled mold bleed is also a cosmetic defect that may result in unacceptability of an otherwise good product.

In the prior art, this mold bleed has generally been removed by abrading or by chemical action of some type. The abrading or chemical action step involves an economic cost in that the abrading and/or chemical action step must be added. In addition, the abrading and/or chemical action step may damage, contaminate or cause removal of all or part of the palladium coating over the lead frame, thereby minimizing or eliminating the beneficial effects derived from the palladium coating.

Stamp forming tools are used to bend sheet metal to desired shapes. By applying additional force at the bends, it is possible to set the shape. This action is called coining. Coining occurs when pressure is applied to localized areas so as to result in flow of the material. More particularly, this process is used in this application to form lead frame exposed pad features and insure that the pad is flat to the edges in order that the bleed barrier groove is effective. FIG. 19 illustrates stamp forming tool applied to the creation of deep downset exposed pad for a lead frame. The lead frame is placed between a tool 1906 and an anvil 1908. The tool 1906 is moved to bend the lead frame 1910 to the desired shape and coins the lead frame against the anvil 1908. The area of the lead frame 1910 to be coined is controlled by the clearances between the tool 1906 and anvil 1908. Where less coining is desired, greater clearances are allowed and conversely, where more coining is desired, the clearances are reduced. The lead frame exposed pad 1910 includes a wing 1912; typically, there will be 2 to 4 wings. The wing 1912 is formed during the downset of the of the exposed pad. However, typically coining in the area indicated by arrow 1902 and 1904 reaches its limit before the bottom of the exposed pad bottoms out on the anvil. This leads to a problem in that the exposed pad edge 1914 is not flat. Flatness of the exposed pad 1910a is generally required all the way to the edge 1914 in order to slow the mold bleed sufficiently so the groove 1916 can freeze off the bleed.

As illustrated in FIG. 19, the anvil 1908 is a single piece. Since it is difficult to machine the corner 1918 of this single piece without rounding the corner 1918, it is difficult to achieve a nonrounded or sharp angular corner 1920 of lead frame 1910 through coining of the lead frame.

SUMMARY OF THE INVENTION

In accordance with the present invention, the above described problems of the prior art are minimized if not eliminated.

Briefly, the above is accomplished by providing a barrier to the encapsulant travel over the thermal pad during device encapsulation. This is accomplished in several ways in accordance with the present invention. In accordance with one group of embodiments of the invention, a groove or grooves of various possible shapes are formed in the lead frame itself by stamping, etching or the like. The groove surrounds all or part of the thermal pad so that any encapsulant traveling toward the center of the thermal pad freezes at the entrance to the groove and therefore acts as a block to the travel of encapsulant over the thermal pad. In some cases, the encapsulant may fill the groove and travels no further. As a second group of embodiments, the groove or grooves can be formed in the mold. As a third group of embodiments, ridges can be placed in the mold to prevent the movement of the encapsulant over the exposed surface of the thermal pad. As a fourth group of embodiments, ridges can be formed on the lead frame surface. In the case of the grooves, the encapsulant is either trapped in the grooves or freezes when entering a groove to inhibit further travel of encapsulant over the thermal pad surface. In the case of the ridges, the ridges rest against the surface of the mold, generally but not necessarily under compression, to act as a barrier to the travel of the encapsulant beyond the ridges and over the surface of the thermal pad. The action is the same as the groove but reversed in implementation.

In those instances wherein the features of the grooves are stamped into the lead frame, there can be greater swelling due to displaced material where grooves meet at a corner. This swelling at the corners results in a failure to maintain the lead frame flat with the mold and permits encapsulant to travel to the thermal pad via longer straight line regions. This problem can be minimized for stamped grooves by avoiding the sharp corners and, instead, providing relatively large corner radii. However, large radii are not often practical. The solution for stamped grooves was to pattern ends of grooves short of the corner or groove line segment such that swelling by displaced groove material created an effective swelling equivalent to the swelling of the straight line segments (see FIGS. 13, 13a, 13b and 14). Etched grooves do not introduce any swelling and can easily be patterned for any shape.

The grooves can take various shapes, examples of these shapes being "V," check, sawtooth, square and rectangular, as well as a concave cup in the case of etching. The grooves will generally have a depth equal to about half of their width though there is no requirement to utilize this dimension ratio.

As a result of the subject invention, bleed control is provided by design into the lead frame or mold to provide lower cost and higher assembly throughout than is obtained by the prior art chemical deflash, mechanical deflash, liquid or tape masking or the pad/slug and by use of tape, chemical or special materials in the package mold.

The present invention requires no chemicals, wet processing or added plating cost. In addition, no processing is required which will degrade package reliability, and no additional assembly processes or materials are required. The palladium solderable finish, when used, is preserved over the lead frame, and the groove provides better ability for quality control inspection for mold bleed.

Additionally, the present invention includes an apparatus for providing a downset for a semiconductor chip. The downset is formed using modular tools instead of a single machine tool. This allows for sharp corners with zero radius bends.

BRIEF DESCRIPTION OF THE DRAWINGS

FIG. 1a is a view of the surface of a lead frame containing a groove in accordance with the present invention;

FIG. 1b is a cross-section view taken through the center of the die mounted onto the lead frame in FIG. 1a;

FIG. 1c is a side view of the lead frame of FIG. 1a;

FIG. 1d is an enlarged view of a groove corner having a rounded geometry in accordance with the present invention;

FIG. 1e is an enlarged view of a groove corner having a chamfered geometry in accordance with the present invention;

FIG. 1f is an enlarged view of a groove corner having open corner geometry in accordance with the present invention;

FIGS. 2 to 11 show various embodiments in accordance with the present invention;

FIG. 12a shows an etched groove cross-section;

FIGS. 12b to 12e show various stamp groove configurations;

FIGS. 13a to 13e show design techniques for matching swelling of stamped groove junctures and line segments;

FIG. 14 shows the implementation of stamped bleed barrier grooves that provide simple, flexible, economical groove tooling and uniform swelling of line segments and junctures;

FIGS. 15a and 15b show top and cross-sectional view of the implementation of etched bleed barrier grooves in a HTQFP package.

DETAILED DESCRIPTION OF THE PRESENT INVENTION

Figure 3:
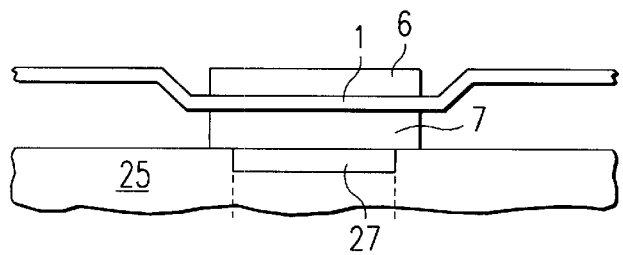

The present invention is a design for stamp tooling to form features in exposed lead frame pad and keep the pad flat to the edges even if there may be material strength non-uniformity due to bleed barrier grooves. This is important to restrict mold bleed sufficiently so that the groove can freeze off the bleed.

Modular stamp tooling die of the present invention produces a sharp edge and flat exposed pad area between bleed groove and edge of exposed pad. Locating the groove as near the edge of the exposed pad lead provides for maximum exposed solderable area as well as allow outward material expansion/swelling due to stamping of groove feature. Also desirable to have sharp exposed pad edges so as to impart a well defined controlled line between the package mold compound the exposed pad.

Referring first to FIG. 1a, there is shown a lead frame 1 having a plurality of lead fingers 3 and a thermal pad region 5 which contains one of a thermal pad (better shown in FIGS. 1b and 1c). A semiconductor chip or die 6, shown in FIGS. 1a and 1b, will be positioned over the thermal pad 5. A groove 9 (on the opposite side of the lead frame from the die) surrounds a major portion of the thermal pad 5. The stamp groove may have radius corners 11a, chamfered corners 11b, or open corners 11c, shown in FIGS. 1d, 1e and 1f, which are designs to avoid the build-up of lead frame material at the corners during groove formation. The groove 9 can take any one of several shapes as shown in FIG. 12. A V-shaped groove with a chamfered groove corner is shown in FIGS. 1a and 1e as an example.

In order to fabricate a semiconductor device, the lead frame of FIGS. 1a to 1c is provided with a semiconductor chip disposed over the thermal pad 5. The chip 6 is bonded to the top of the lead frame thermal pad 5, and the groove 9 is disposed on the opposite side of the lead frame from the chip, and the thermal pad remains exposed after molding is completed (encapsulation with plastic).

FIGS. 2 to 5 show lead frames with a thermal slug or dual thickness lead frames.

Referring to FIG. 2, there is shown a lead frame 1 having a thermal slug 7 secured thereto. The thermal slug 7 is disposed in a cavity 21 in a mold 23 with a space being provided between the sides of the cavity 21 and the thermal slug 7. A chip 6 is secured to the lead frame 1 on the lead frame surface opposed to the slug 7 and directly adjacent to or over the slug. During encapsulation, the encapsulant will travel into the cavity and freeze in the cavity region between the slug 7 and the cavity side wall. This will prevent the further travel of encapsulant over the surface of the thermal slug 7.

Referring to FIG. 3, there is shown the same lead frame 1 and thermal slug 7 as shown in FIG. 2. The mold 25 has a cavity 27 with the thermal slug 7 resting over the cavity. During encapsulation, the encapsulant will travel into the cavity 27 and freeze as it enters the cavity, assuming that the cavity is not filled with encapsulant. In this case, some encapsulant may remain in the cavity 27 when the encapsulated device is removed from the mold.

Figure 4:
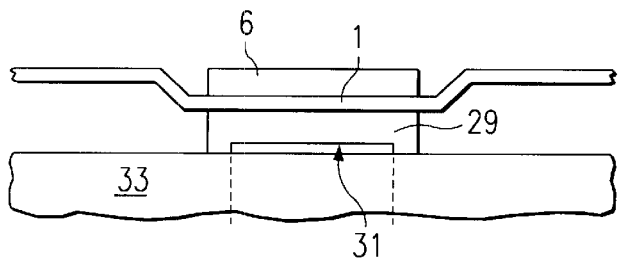

Referring to FIG. 4, there is shown the same lead frame 1; however, the thermal slug 29 has been altered to have a cavity 31, the edges of the cavity contacting the mold 33. The perimeter of the cavity 31 acts as a barrier to the movement of the encapsulant into the cavity.

Figure 5:
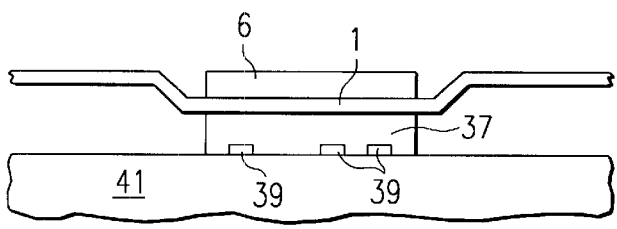

Referring to FIG. 5, there is shown the same lead frame 1; however, the thermal slug 37 has been provided with one or a plurality of grooves 39 of the type discussed above with reference to FIGS. 12a to 12e. The grooves 39 contact the mold 41. During encapsulation, any encapsulant which travels between the mold 41 and the slug 37 is trapped in a groove 39 which surrounds the slug. One or two grooves can be used, this FIGURE showing both possibilities in part.

FIGS. 6 to 11 show single-piece deep downset thermal pad lead frames (POWER PAD™) with grooves.

Figure 6:
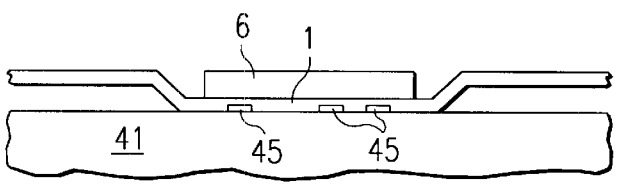

Referring to FIG. 6, there is shown lead frame 1 with grooves 45 in the lead frame. The grooves 45 operate against the mold 41 in the same manner as discussed above with reference to FIG. 5.

Figure 7:
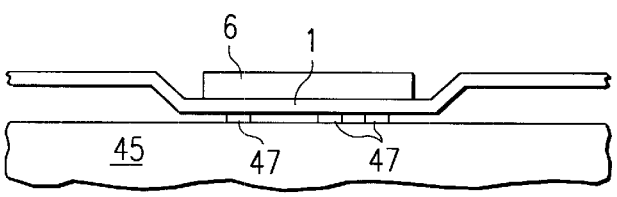

Referring to FIG. 7, there is shown a lead frame 1 wherein ridges 47 are disposed in the mold 45. Fabrication takes place in the same manner as discussed above with reference to FIG. 4.

Figure 8:
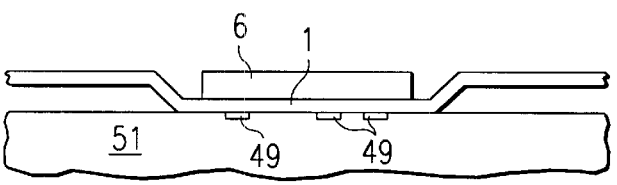

Referring to FIG. 8, there is shown a lead frame 1 wherein the grooves 49 are disposed in the mold 51. Fabrication takes place in the same manner as discussed above with reference to FIGS. 5 or 6.

Figure 9:
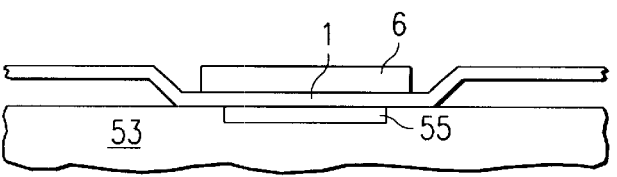

Referring to FIG. 9, there is shown a lead frame 1 with the thermal pad resting over a cavity 55 in the mold 53. Fabrication takes place in the same manner as discussed above with reference to FIG. 3.

Referring to FIG. 10, there is shown a lead frame 1 with the thermal pad resting within a cavity 57 in the mold 59. Fabrication takes place in the same manner as set forth above with reference to FIG. 2.

Referring to FIG. 11, there is shown a lead frame 1 with ridges 61 in the lead frame forming a cavity 63 between the lead frame, the ridges and the mold 65. Fabrication takes place in the same manner as set forth above with reference to FIG. 4.

It should be understood that, in all cases wherein an exposed thermal pad lead frame is discussed, this can be replaced with a thermal slug or thickened lead frame. Also, all grooves can have any of the above discussed shapes as well as many other shapes. The stamped "V" shape and etched groove being the easiest to fabricate, but the square or rectangle shaped groove provides the best shape to retain encapsulant.

Referring to FIGS. 12a to 12e, there are shown typical groove shapes that can be used, FIG. 12a showing a cup-shaped groove obtained by etching. Etched grooves offer great flexibility in a groove flat pattern. The depth and width of the groove are controlled through the photo tool artwork.

Shapes obtainable by stamping are shown in FIGS. 12b to 12e with FIG. 12b showing a V-shaped groove, FIG. 12c showing a check-shaped groove, FIG. 12d showing a sawtooth-shaped groove, and FIG. 12e showing a square-shaped groove. The sharp square or rectangular or sawtooth groove is preferred; however, the "V" is the easiest to implement. The balanced "V" groove swells equally on both sides of the groove.

FIGS. 13a to 13e show design techniques for matching swelling of stamped groove junctures 73 and line segments 71. During design, the groove swelling is projected, and the location of the adjoining grooves 71 is set so that the projected swelling at junctures 73 is equal to that for the longer line segments. The grooves at the ends of the line segments 73 are angled to achieve the desired uniform projected swelling. By building the stamped groove in the line segment, the tooling is made much easier to fabricate and accommodate design changes.

FIG. 14 shows the implementation of "stamped" bleed barrier grooves 43 to provide simple, flexible, economical groove tooling and uniform swelling of line segments and junctures. This line segment groove is a good high-volume production design that provides lower stamp groove tooling and maintenance cost.

FIG. 15 shows the implementation of "etched" bleed barrier grooves 41 in a HTQFP package. The groove pattern is placed in the etch lead frame artwork and, hence, often results in no added cost or process steps.

Forming features in the downset lead frame exposed pad creates a need to design tool set with carefully controlled clearance and sharp well defined cavity in the anvil in order to achieve overall flatness of the exposed pad all the way to the edges. These requirements are met by the herein described tool coining design and modular tool design.

Figure 16:
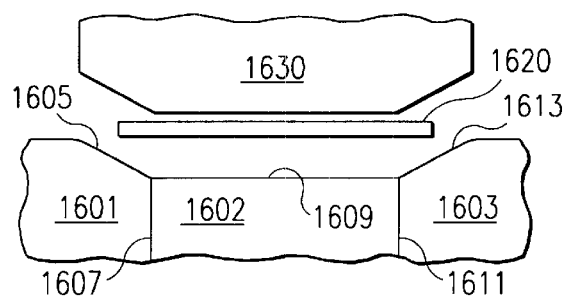
FIGS. 16, 17, 18, 19 and 20 illustrate tools used in conjunction with the present invention.
Figure 17:
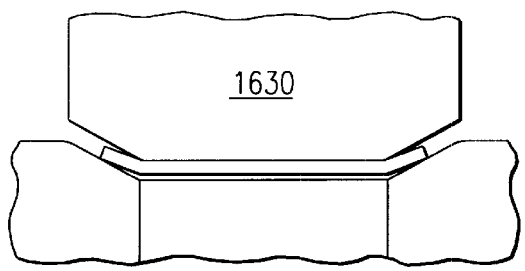
Figure 18:
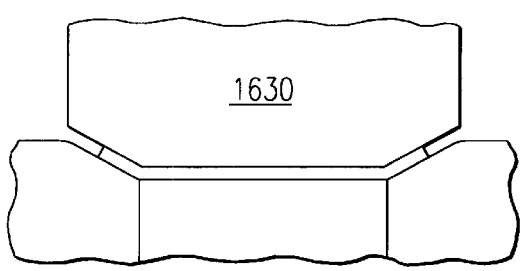
Figure 19:
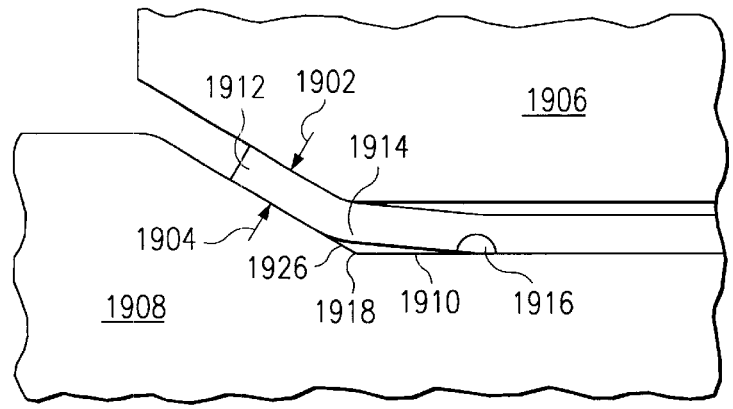

FIGS. 16, 17 and 18 illustrate stamp tooling design of the present invention. The toolset apparatus includes a pressure device 1630 to stamp the lead frame 1620. While lead frame 1620 includes grooves, other implementations of the present invention include a lead frame without grooves. In opposition to the pressure device 1630 are anvils 1601,1602 and 1603. The force of pressure device 1630 against lead frame 1620 and against the anvils 1601,1602 and 1603 bends lead frame 1620 to form a wing on the exposed pad. The tools 1601, 1602, and 1603 are typically made of hardened tool steel.

Because the anvils 1601, 1602 and 1603 are not one piece, but a multiple-piece modular tool, the inside corners of the anvil cavity have no radius. There is no radius in the corners because each side 1605, 1607, 1609, 1611 and 1613 are machined flat and, where joined together, do not have any radius. Since the present invention uses a modular tool, the lead frame, pad, support strap and/or wings can be formed with sharp corners and maintains L/F pad flat beyond the grooves to the edges of the pad.

Figure 20:
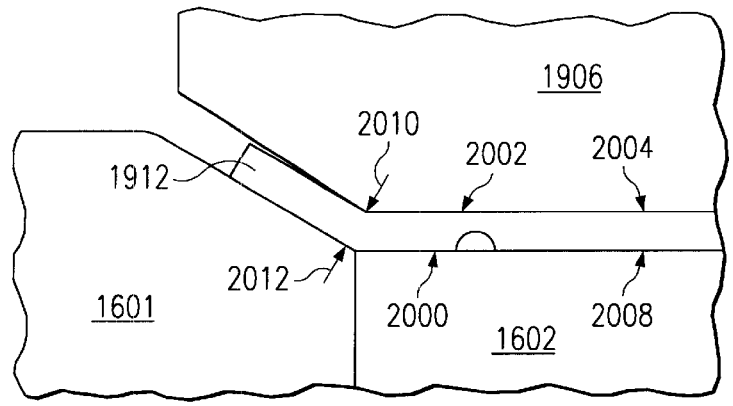

FIG. 20 illustrates the anvils 1601 and 1602 and tool (pressure device) 1906 with lead frame of the present invention. As described, more coining is done as illustrated by arrows 2002, 2004, 2006, 2008, 2010 and 2012. The clearances at arrows 2002, 2004, 2006 and 2008 are reduced and the clearances at the wing 1912 are increased so that less coining is performed toward the top of the wing. Additionally, coinage is applied at arrow 2010 and 2012. Correspondingly, the lead frame exposed pad is flat all the way to the edges.

FIGS. 17 and 18 illustrate the operation of the present invention. Pressure device 1630 presses against the lead frame 1620 until the clearance of lead frame 1620, illustrated by cross-section in FIG. 17, is exceeded. FIG. 18 illustrates that pressure device 1630 reaches the final position to form an exposed pad with wings. The pressure device 1630 is subsequently raised, and a new lead frame is placed into the downset device. The shapes imparted to the lead frame 1620 are sharp and geometrical without rounding due to the fact that the sides 1617, 1619, 1621 and 1615 are substantially under the angles to be formed in the lead frame.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method to form a lead frame, comprising:
    forming said lead frame with a first anvil with a second anvil,
    forming said lead frame with said second anvil positioned adjacent to said first anvil, and
    compressing said lead frame with a tool between said tool and said first and second anvil,
    wherein said compression step is performed with less clearance adjacent to said first anvil and tool with more clearance adjacent to said second anvil and tool.

* * * * *